(12) United States Patent
Minamida et al.

(10) Patent No.: US 8,662,811 B2
(45) Date of Patent: Mar. 4, 2014

(54) SUBSTRATE PROCESSING APPARATUS

(75) Inventors: Junya Minamida, Kumamoto (JP); Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 498 days.

(21) Appl. No.: 12/917,638

(22) Filed: Nov. 2, 2010

(65) Prior Publication Data

US 2011/0103923 A1    May 5, 2011

(30) Foreign Application Priority Data

Nov. 4, 2009 (JP) ................................. 2009-252973
Aug. 11, 2010 (JP) ................................. 2010-180538

(51) Int. Cl.
*H01L 21/677* (2006.01)
(52) U.S. Cl.
USPC ........................................................ 414/217
(58) Field of Classification Search
USPC ................ 414/217, 222.01, 935, 937, 939, 414/222.13, 226.05, 403, 404, 416.01, 414/416.03; 454/187, 234
See application file for complete search history.

(56) References Cited

U.S. PATENT DOCUMENTS

| | | | | |
|---|---|---|---|---|
| 5,536,320 A * | 7/1996 | Ushikawa et al. | ............. | 118/719 |
| 5,810,538 A * | 9/1998 | Ozawa et al. | ................. | 414/217 |
| 5,829,939 A * | 11/1998 | Iwai et al. | ....................... | 414/411 |
| 5,944,894 A * | 8/1999 | Kitano et al. | .................. | 118/326 |
| 6,074,154 A * | 6/2000 | Ueda et al. | ..................... | 414/217 |
| 6,161,969 A * | 12/2000 | Kimura et al. | ................ | 396/611 |
| 6,290,405 B1 * | 9/2001 | Ueda | ............................. | 396/611 |
| 6,318,944 B1 * | 11/2001 | Shimeno et al. | ............. | 414/172 |
| 6,347,990 B1 * | 2/2002 | Sung et al. | ..................... | 454/187 |
| 6,372,042 B1 * | 4/2002 | Sung et al. | ....................... | 118/52 |
| 6,672,779 B2 * | 1/2004 | Ueda et al. | ..................... | 396/604 |
| 6,786,970 B2 * | 9/2004 | Oh et al. | .......................... | 118/58 |
| 7,022,009 B2 * | 4/2006 | Kim | .............................. | 454/187 |
| 7,789,609 B2 * | 9/2010 | Okabe et al. | .................. | 414/217 |
| 7,955,044 B2 * | 6/2011 | Moriya et al. | ................ | 414/806 |
| 2003/0050005 A1 * | 3/2003 | Nakao | ........................... | 454/187 |
| 2006/0165409 A1 * | 7/2006 | Akimoto et al. | .............. | 396/611 |

FOREIGN PATENT DOCUMENTS

| | | |
|---|---|---|
| JP | 04-085812 A | 3/1992 |
| JP | 2003-007799 A | 1/2003 |
| JP | 2008-034490 A | 2/2008 |

* cited by examiner

*Primary Examiner* — Saul Rodriguez
*Assistant Examiner* — Glenn Myers
(74) *Attorney, Agent, or Firm* — Pearne & Gordon LLP

(57) ABSTRACT

Manufacturing cost or energy consumption of a substrate processing apparatus can be reduced. The substrate processing apparatus includes a substrate loading/unloading unit (a substrate transit chamber 12) that transfers a substrate 2 accommodated in a carrier 3; a substrate transfer chamber 14 (25) communicating with the substrate loading/unloading unit via a substrate loading/unloading port 37 (39); a plurality of substrate processing chambers 15 to 24 (26 to 35) arranged along the substrate transfer chamber 14 (25); a substrate transfer device 36 (38) provided in the substrate transfer chamber 14 (25) and configured to transfer the substrate 2 between the substrate loading/unloading unit and the substrate processing chambers 15 to 24 (26 to 35); and a clean air flowing unit 41 (42) that allows clean air to flow along the substrate transfer chamber 14 (25).

6 Claims, 5 Drawing Sheets

SUBSTRATE PROCESSING APPARATUS

CROSS-REFERENCE TO RELATED APPLICATION

This application claims the benefit of Japanese Patent Application No. 2009-252973 filed on Nov. 4, 2009 and Japanese Patent Application No. 2010-180538 filed on Aug. 11, 2010, the entire disclosures of which are incorporated herein by reference.

FIELD OF THE INVENTION

The present disclosure relates to a substrate processing apparatus that performs, e.g., a cleaning process on a substrate such as a semiconductor wafer.

BACKGROUND OF THE INVENTION

In a manufacturing process of a semiconductor device or a flat panel display (FPD), a substrate processing apparatus has been widely used to perform a cleaning process or an etching process by supplying a processing solution onto a semiconductor wafer or a glass substrate as a processing target substrate.

The substrate processing apparatus includes a substrate transfer chamber elongated in a central region of a rectangular box-shaped housing and a plurality of substrate processing chambers arranged on left and right sides along the substrate transfer chamber.

In the substrate processing apparatus, a substrate is transferred into each of the substrate processing chamber by a substrate transfer device installed within the substrate transfer chamber. After various processes are performed on the substrate in the respective substrate processing chambers, the processed substrate is unloaded from the substrate processing chamber by the substrate transfer device.

In such a substrate processing apparatus, in order to maintain clean air atmosphere within the substrate transfer chamber, a fan filter unit and an air exhaust unit are installed at a ceiling and a bottom of the substrate transfer chamber, respectively, as a clean air flowing unit.

In the substrate processing apparatus having such a configuration, clean air is sucked into the substrate transfer chamber by the fan filter unit and then is exhausted by the air exhaust unit. Accordingly, the clean air is flown downward within the substrate transfer chamber from the top (see, for example, Patent Document 1).

Patent Document 1: Japanese Patent Laid-open Publication No. 2008-34490

In the conventional substrate processing apparatus as stated above, however, if the number of the substrate processing chambers arranged on the lateral sides of the substrate transfer chamber is increased so as to improve processing capacity, the clean air flowing unit including the fan filter unit and the air exhaust unit installed within the substrate transfer chamber may be scaled up, resulting in increase of energy consumption or manufacturing cost.

Furthermore, in case that the substrate processing chambers or the substrate transfer chambers are vertically arranged in multiple levels, a configuration of the clean air flowing unit would become complicated, resulting in scale-up of the apparatus or increase of manufacturing cost.

BRIEF SUMMARY OF THE INVENTION

In accordance with one aspect of the present disclosure, there is provided a substrate processing apparatus including: a substrate loading/unloading unit that transfers a substrate accommodated in a carrier; a substrate transfer chamber communicating with the substrate loading/unloading unit via a substrate loading/unloading port; a plurality of substrate processing chambers arranged along the substrate transfer chamber; a substrate transfer device provided in the substrate transfer chamber and configured to transfer the substrate between the substrate loading/unloading unit and the substrate processing chambers; and a clean air flowing unit that allows clean air to flow along the substrate transfer chamber.

Further, the clean air flowing unit may generate a flow of clean air in a horizontal direction within the substrate transfer chamber.

Furthermore, the clean air flowing unit may include an air supply unit provided at a sidewall on one end of the substrate transfer chamber; and an air exhaust unit provided at a sidewall on the other end of the substrate transfer chamber.

Further, the air supply unit may be provided at the sidewall of the substrate transfer chamber on the side of the substrate loading/unloading unit.

Furthermore, the air supply unit may be provided at a position above the substrate loading/unloading port.

Further, the air supply unit and the substrate loading/unloading port may be provided at a partition wall that separates and hermetically seals the substrate transfer chamber from a substrate transit chamber.

Furthermore, the air supply unit may be provided at a position capable of generating a flow of clean air in a horizontal direction within a range of a substrate transfer region in which the substrate is transferred by the substrate transfer device.

Further, the substrate transfer chamber may be provided with the substrate loading/unloading port in a height range corresponding to a substrate transfer region in which the substrate is transferred by the substrate transfer device.

Furthermore, the substrate loading/unloading unit may be provided with a clean air flowing unit that allows clean air to flow downward from the top within the substrate loading/unloading unit, and an internal pressure of the substrate loading/unloading unit may be set to be higher than an internal pressure of the substrate transfer chamber.

In accordance with another aspect of the present disclosure, there is provided a substrate processing apparatus including: a substrate loading/unloading unit that transfers a substrate accommodated in a carrier; a plurality of substrate transfer chambers communicating with the substrate loading/unloading unit via a plurality of substrate loading/unloading ports; a plurality of substrate processing chambers arranged along the substrate transfer chambers; a plurality of substrate transfer devices provided in the substrate transfer chambers and configured to transfer the substrate between the substrate loading/unloading unit and the substrate processing chambers; and a plurality of clean air flowing units that allow clean air to flow along the substrate transfer chambers. Here, the substrate processing chambers and the substrate transfer chambers may be vertically arranged in multiple levels, and each clean air flowing unit may be provided in each substrate transfer chamber.

In accordance with the present disclosure discussed above, the clean air flowing unit allows clean air to flow along a moving direction of the substrate transfer device within the substrate transfer chamber in which the plurality of substrate processing chambers are arranged along the substrate transfer chamber. Thus, the clean air flowing unit can be scaled down, and manufacturing cost or energy consumption of the substrate processing apparatus can be reduced.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, a configuration of a substrate processing apparatus in accordance with an illustrative embodiment of the present disclosure will be described in detail with reference to the accompanying drawings.

Figure 1:
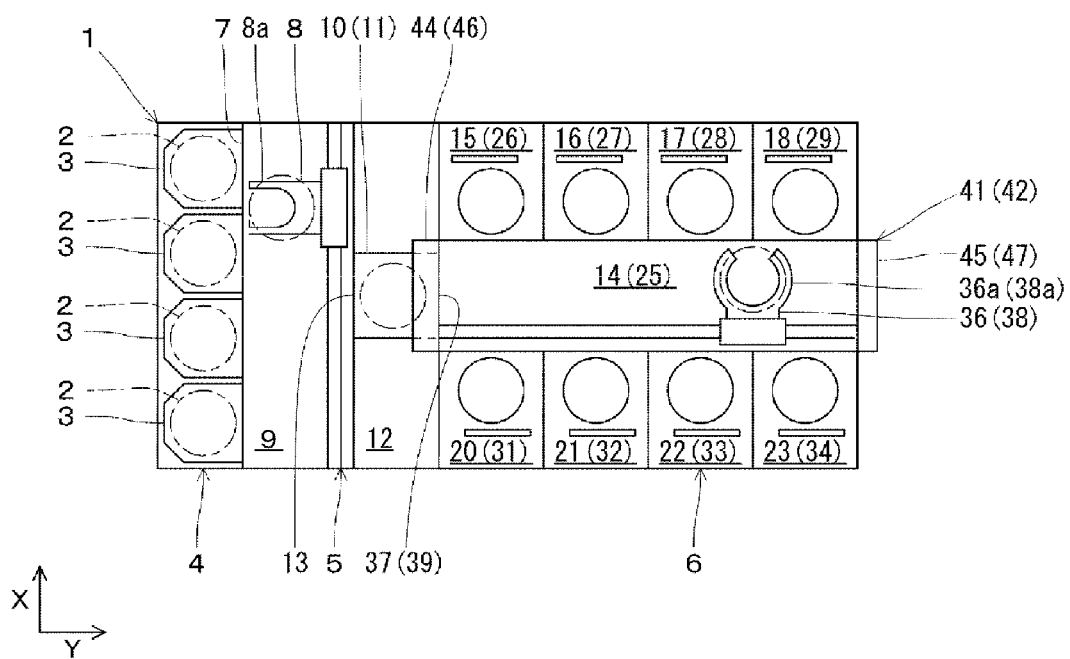
FIG. 1 is a plane view of a substrate processing apparatus.
Figure 2:
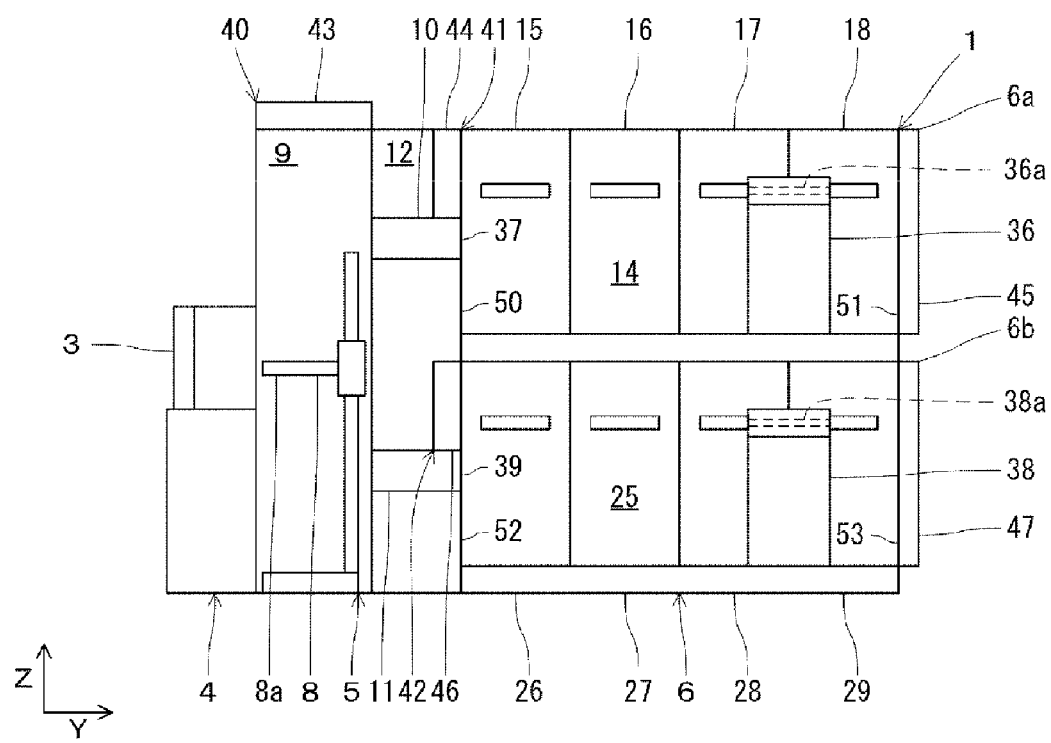
FIG. 2 is a longitudinal cross sectional view of the substrate processing apparatus.

As depicted in FIGS. 1 and 2, a substrate processing apparatus 1 may include a substrate loading/unloading table 4 provided at a front end thereof; a rectangular box-shaped substrate loading/unloading unit (substrate loading/unloading section) 5 at the rear of the substrate loading/unloading table 4; and a rectangular box-shaped substrate processing unit 6 at the rear of the substrate loading/unloading unit 5. The substrate loading/unloading table 4 may be configured to load and unload a plurality of (e.g., about 25) substrates 2 (here, semiconductor wafers) into and from each of carriers 3 in batch. The substrate loading/unloading unit 5 may transfer substrates 2 accommodated in each carrier 3 one by one. The substrate processing unit 6 performs various processes such as cleaning and drying.

The substrate loading/unloading table 4 may be configured to mount thereon four carriers 3 that are in contact with a front wall 7 of the substrate loading/unloading unit 5 at a certain distance in left and right directions. Substrates 2 can be transferred into the substrate loading/unloading unit 5 without being exposed to the atmosphere.

The substrate loading/unloading unit 5 may include, at a front side, a transfer chamber 9 accommodating a transfer device 8; and, at a rear side, a substrate transit chamber 12 accommodating two substrate transit tables 10 and 11 vertically arranged therein. The transfer chamber 9 and the substrate transit chamber 12 are connected and communicate with each other through a transfer port (substrate loading/unloading port) 13.

The substrate loading/unloading unit 5 may include the transfer device 8 and a fan filter unit (air supply unit) 43 installed above the transfer device 8 to supply a downflow of clean air. The transfer device 8 may include a substrate holding arm 8a that holds a substrate 2 thereon; a mechanism that moves the substrate holding arm 8a in a X-axis direction along an arrangement direction of the carriers 3; a mechanism that moves the substrate holding arm 8a in a Y-axis direction perpendicular to the arrangement direction of the carriers 3; and a mechanism that moves the substrate holding arm 8a in a vertical direction (Z-axis direction). The substrates 2 are transferred one by one by the transfer device 8 between one of the carriers 3 on the substrate loading/unloading table 4 and one of the upper and lower substrate transit tables 10 and 11.

The substrate processing unit 6 may have a rectangular parallelepiped housing. Within the housing, a first substrate transfer chamber 14 is elongated in an upper central region of the housing along the Y-axis direction perpendicular to the X-axis direction which is the arrangement direction of the carriers 3. Further, a first to a fourth substrate processing chamber 15 to 18 may be horizontally arranged on the left of the first substrate processing chamber 14, and a fifth to an eighth substrate processing chamber 20 to 23 may be horizontally arranged on the right of the first substrate transfer chamber 14.

Furthermore, the substrate processing unit 6 may further include a second substrate transfer chamber 25 that is elongated in a lower central region of the housing along the Y-axis direction, like the first substrate transfer chamber 14; a ninth to a twelfth substrate processing chambers 26 to 29 that are horizontally arranged on the left of the second substrate transfer chamber 25; and a thirteenth to a sixteenth substrate processing chambers 31 to 34 that are horizontally arranged on the right of the second substrate transfer chamber 25. Further, by setting internal pressures of the respective substrate processing chambers 15 to 18, 20 to 23, 26 to 29 and 31 to 34 to be lower than internal pressures of the first and second substrate transfer chambers 14 and 25, the internal pressures of the respective substrate processing chambers 15 to 18, 20 to 23, 26 to 29 and 31 to 34 are maintained slightly lower than an external pressure. Accordingly, atmospheres of the respective substrate processing chambers 15 to 18, 20 to 23, 26 to 29 and 31 to 34 may not diffuse into the substrate transfer chambers 14 and 25.

Here, the first substrate transfer chamber 14 may include a first substrate transfer device 36 configured to be movable in the Y-axis direction and the first substrate transfer chamber 14 may communicate with the upper substrate transit table 10 of the substrate transit chamber 12 via a first substrate loading/unloading port 37. The first substrate transfer device 36 may include an arm 36a capable of holding a substrate 2 thereon; a mechanism that moves the arm 36a in the Y-axis direction along the first substrate transfer chamber 14; a mechanism that moves the arm 36a in the X-axis direction; a mechanism that moves arm 36a in the Z-axis direction (vertical direction); and a mechanism that rotates the arm 36a on a horizontal plane. With such a configuration, the first substrate transfer device 36 is capable of accessing the substrate delivery table 10 and the substrate processing chambers 15 to 18 and 20 to 23 provided at both sides of the first substrate transfer chamber 14. Further, the second substrate transfer chamber 25 may include a second substrate transfer device 38 configured to be movable in the Y-axis direction and the second substrate transfer chamber 25 may communicate with the lower substrate transit table 11 of the substrate transit chamber 12 via a second substrate loading/unloading port 39. Like the first substrate transfer device 36, the second substrate transfer device 38 also has an arm 38a capable of holding a substrate 2; mechanisms that move this arm in the Y-axis, X-axis and Z-axis directions; and a mechanism that rotates the arm in a horizontal direction. With such a configuration, the second substrate transfer device 38 is capable of accessing the substrate transit table 11 and the substrate processing chambers 26 to 29 and 31 to 34.

As discussed above, the substrate processing unit 6 may have a vertical two-level configuration. The first to fourth substrate processing chambers 15 to 18 and the fifth to eighth substrate processing chambers 20 to 23 are arranged in parallel along the first transfer chamber 14 in a first level (first substrate processing unit set 6a), while the ninth to twelfth substrate processing chambers 26 to 29 and the thirteenth to sixteenth substrate processing chambers 31 to 34 are arranged in parallel along the second transfer chamber 25 in a second level (second substrate processing unit set 6b).

Further, in the substrate processing unit 6, substrates 2 horizontally held on the first or the second substrate transfer device 36 or 38 are transferred one by one between the substrate transit chamber 12 of the substrate loading/unloading unit 5 and each of the substrate processing chambers 15 to 18, 20 to 23, 26 to 29 and 31 to 34. The substrates 2 are then processed in each of the substrate processing chambers 15 to 18, 20 to 23, 26 to 29 and 31 to 34 one by one.

The inside of the substrate processing apparatus 1 having the above-described configuration may be filled with clean air in order to prevent adhesion of particles or the like to the substrates 2. For the purpose, clean air flowing units 41 and 42 for flowing clean air may be installed in the upper and lower levels of the substrate processing unit 6, respectively.

Figure 3:
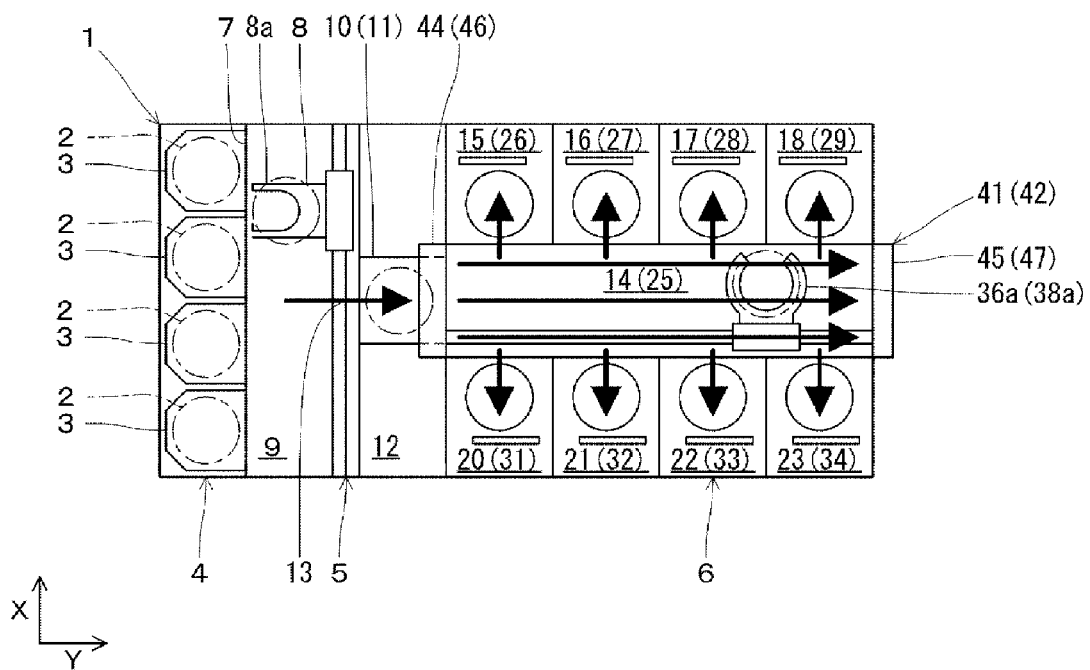
FIG. 3 is a plane view for describing a flow of clean air within a substrate transfer chamber.
Figure 4:
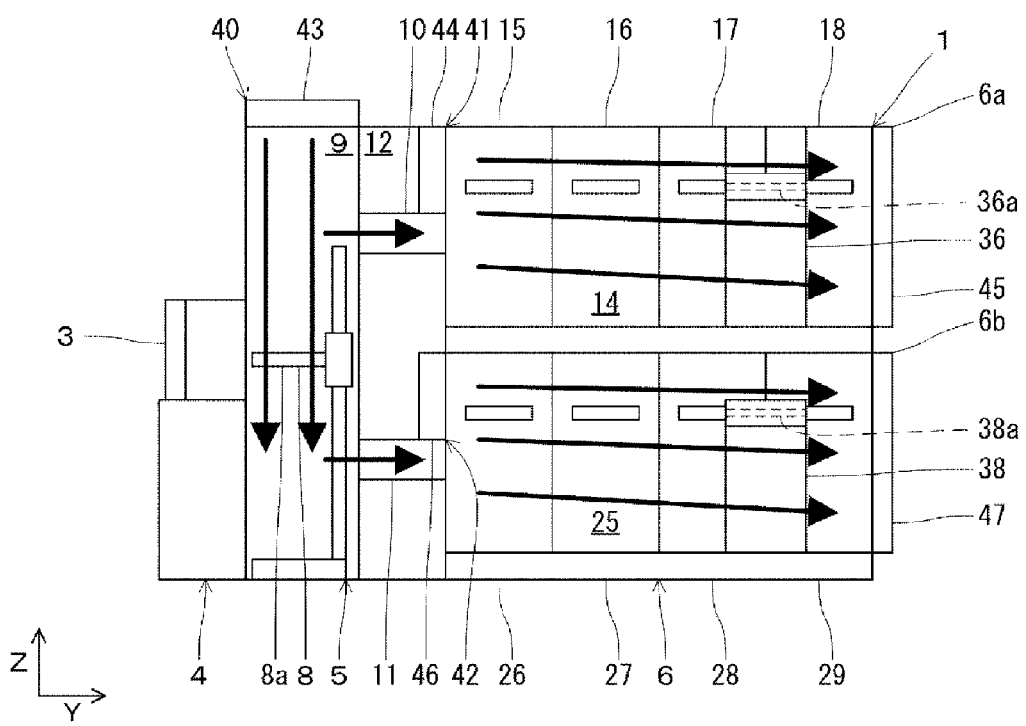
FIG. 4 is a longitudinal cross sectional view for describing a flow of clean air within the substrate transfer chamber.

The clean air flowing unit 41 installed on the side of the upper level (on the side of the first processing unit set 6a) of the substrate processing unit 6 may include a fan filter unit 44 and an air exhaust unit 45. The fan filter unit 44 as an air supply unit may be installed at a position above the first substrate loading/unloading port 37 (i.e., in an upper region of the substrate transit chamber 12) and provided at a sidewall 50 on a front end (on the side of the substrate loading/unloading unit 5) of the first substrate transfer chamber 14. Meanwhile, the air exhaust unit 45 may be installed at a sidewall 51 on a rear end of the first substrate transfer chamber 14. Accordingly, in the substrate processing apparatus 1, a horizontal flow (sideflow) of clean air is generated along the first substrate transfer chamber 14 from the fan filter unit 44, which is positioned to face the first substrate transfer chamber 14, toward the air exhaust unit 45, as illustrated in FIGS. 3 and 4.

Likewise, the clean air flowing unit 42 installed on the side of the lower level (on the side of the second processing unit set 6b) of the substrate processing unit 6 may include a fan filter unit 46 and an air exhaust unit 47. The fan filter unit 46 as an air supply unit may be installed at a position above the second substrate loading/unloading port 39 (i.e., in a central region of the substrate transit chamber 12) and provided at a sidewall 52 on a front end of the second substrate transfer chamber 25. Meanwhile, the air exhaust unit 47 may be installed at a sidewall 53 on a rear end of the second substrate transfer chamber 25. Accordingly, in the substrate processing apparatus 1, a horizontal flow of clean air is generated along the second substrate transfer chamber 25 from the fan filter unit 46, which is positioned to face the second substrate transfer chamber 25, toward the air exhaust unit 46, as illustrated in FIGS. 3 and 4.

Further, in the substrate loading/unloading unit 5, the fan filter unit 43 as the air supply unit is installed at a ceiling of the transfer chamber 9, and a non-illustrated air exhaust unit is also provided. Accordingly, in the substrate processing apparatus 1, a downflow of clean air flowing downward from the top is generated by the fan filter unit 43, and, thus, the inside of the transfer chamber 9 can be maintained clean. Here, by controlling an internal pressure of the transfer chamber 9 to be higher than internal pressures of the first and second substrate transfer chambers 14 and 25, a part of the downflow generated by a clean air flowing unit 40 flows into the first and second substrate transfer chambers 14 and 25 through the first and second substrate transit tables 10 and 11 and then is turned into a horizontal airflow (sideflow) flowing toward the air exhaust units 45 and 47 installed in the respective first and second substrate transfer chambers 14 and 25, as shown in FIG. 4. That is, the transfer chamber 9 and the air exhaust units 45 and 47 are configured to function as a cleaning air flowing unit.

Here, in the substrate processing unit 6, the first and second substrate transfer chambers 14 and 25 and the substrate transit chamber 12 of the substrate loading/unloading unit 5 are separated and hermetically sealed against each other by partition walls (sidewall 50 and 52). The fan filter units 44 and 46 (or the air exhaust units 45 and 47) of the clean air flowing units 41 and 42 are installed on the sidewalls 50 and 52 of the first and second substrate transfer chambers 14 and 25, respectively, and the first and second substrate loading/unloading ports 37 and 39 are provided below the fan filter units 44 and 46, respectively.

Figure 5:
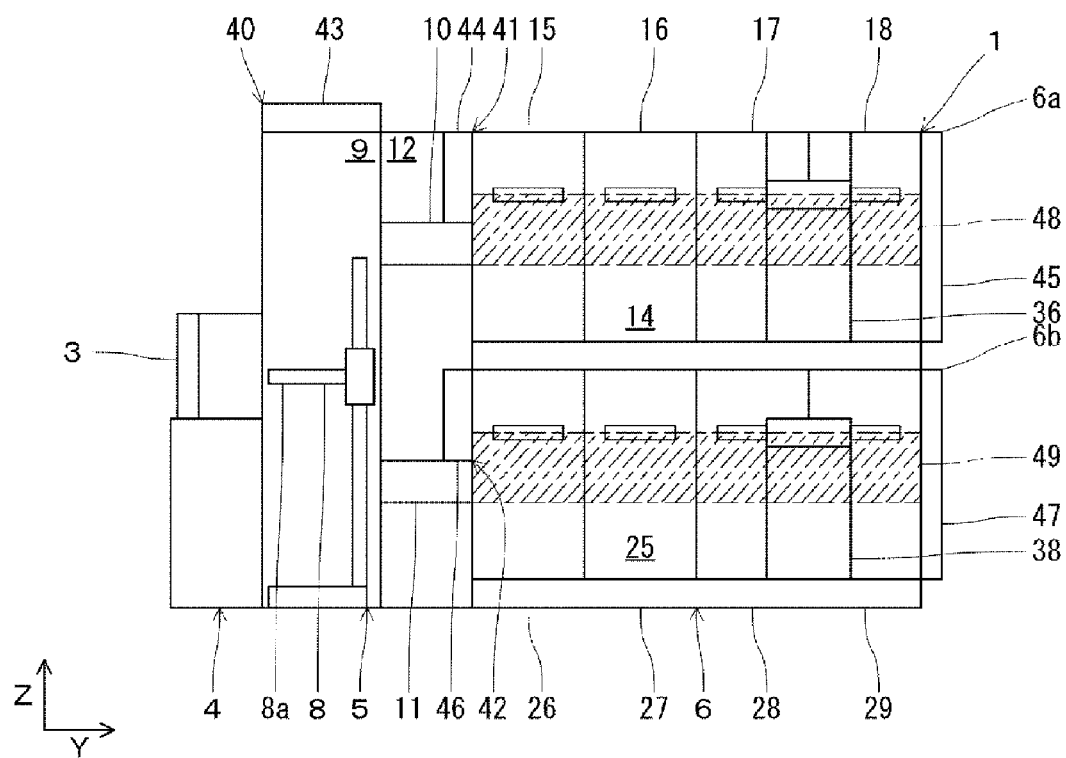
FIG. 5 is a longitudinal cross sectional view showing a substrate transfer region.

Here, in the substrate processing apparatus 1, as illustrated in FIG. 5, a sideflow of clean air needs to be generated at least in a region including a substrate transfer region 48 (49) in which a substrate 2 is transferred by the substrate transfer device 36 (38) within the substrate transfer chamber 14 (25) (i.e., in a region between a lowermost position and an uppermost position of the substrate 2 transferred by the substrate transfer device 36 (38)). For the purpose, the first substrate loading/unloading port 37 (the second substrate loading/unloading port 39) may be provided at a height corresponding to a lower portion of the substrate transfer region 48 (49), and the fan filter unit 44 (46) may be positioned above the substrate loading/unloading port 37 (39), i.e., at a height corresponding to an upper portion of the substrate transfer region 48 (49). Meanwhile, the air exhaust unit 45 (47) may be positioned in a height range corresponding to the entire substrate transfer region 48 (49). With this configuration, a sideflow can be generated in the entire substrate transfer region 48 (49).

Moreover, in order to generate the sideflow in the substrate transfer region 48 (49), the fan filter unit 44 (46) as the clean air flowing unit or the substrate loading/unloading port 37 (39) needs to be provided only in a height range corresponding to the substrate transfer region 48 (49). In the present embodiment, however, the sideflow is generated in the entire region including the upper region of the substrate transfer region within the substrate transfer chamber 14 (25). By providing the fan filter unit 44 (46) as the clean air flowing unit or the substrate loading/unloading port 37 (39) in such a way, particles that might be dropped from the top of the substrate transfer region 48 (49) due to gravity can be prevented from being introduced into the substrate transfer region 48 (49).

Meanwhile, the fan filter unit 44 (46) or the air exhaust unit 45 (47) may be positioned in a range including a part of a region above an upper end or a region below a lower end of the substrate transfer region 48 (49)). Alternatively, the fan filter unit 44 (46) or the air exhaust unit 45 (47) may be installed on the entire sidewall of the substrate transfer chamber.

Further, a flow rate and a flow velocity of the fan filter unit 43 installed in the substrate loading/unloading unit 5, an exhaust amount of the air exhaust unit (not shown) installed in the substrate loading/unloading unit, flow rates and flow velocities of the fan filter units 44 and 46 installed in the substrate processing unit 6, and exhaust amounts of the air exhaust units 45 and 47 are controlled such that a flow rate and a flow velocity of the sideflow generated by the fan filter units 44 and 46 is substantially the same as a flow rate and a flow velocity of the sideflow supplied from the substrate loading/unloading ports 37 and 39, respectively. Under such a control, uniform sideflows of clean air capable of flowing straightforward without interfering each other can be generated in the substrate transfer chambers by the clean air flowing units.

Further, the present disclosure can be modified in various ways without being limited to the illustrative embodiment. For example, in the present embodiment, it has been described that a flow of clean air is generated in a horizontal direction from the front ends of the first and second substrate transfer chambers 14 and 25 (i.e., from the substrate loading/unloading unit 5) toward the rear ends of the substrate transfer chambers 14 and 25. However, clean air may flow from the rear ends toward the front ends within the first and second substrate transfer chambers 14 and 25. In such a case, the fan filter units 44 and 46 may be installed at the rear end sidewalls 51 and 53 of the first and second substrate transfer chambers 14 and 25, respectively, while the air exhaust units 45 and 47 and the substrate loading/unloading ports 37 and 39 may be installed at the front end sidewalls 51 and 53 of the first and second substrate transfer chambers 14 and 25, respectively. Further, an internal pressure of the substrate loading/unloading unit 5 may be set to be lower than internal pressures of the first and second substrate transfer chambers 14 and 25.

Moreover, although it has been described that the fan filter units 44 and 46 of the clean air flowing units 41 and 42 supply clean air in the above-described embodiment, clean air generated outside the substrate processing apparatus 1 may be supplied.

In addition, although it has been described that the substrate processing unit 6 has the vertically stacked configuration in two levels (first and second substrate processing unit sets 6a and 6b) in the above-discussed embodiment, the substrate processing unit 6 may have a single level configuration or three or more level configuration. Further, although the embodiment has been described for the case of using a semiconductor wafer as the substrate 2, the present disclosure may be also applicable to other types of substrates such as a substrate for a LCD (Liquid Crystal Display).

As described above, in the substrate processing apparatus 1, since the clean air is flown in a horizontal direction along the first and second substrate transfer chambers 14 and 25 by the clean air flowing units 41 and 42, the clean air flowing units 41 and 42 may operate within vertical ranges shorter than lengths of the first and second substrate transfer chambers 14 and 25 in forward-backward direction. Accordingly, as compared to a conventional configuration in which clean air is flown downward from the top, the clean air flowing units 41 and 42 of the present disclosure can be made compact, and, thus, manufacturing cost or energy consumption can be reduced.

Moreover, in the substrate processing apparatus 1, since the clean air flowing units 41 and 42 are provided in the first substrate transfer chamber 14 of the upper level and the second substrate transfer chamber 25 of the lower level, respectively, the internal configuration of the substrate processing apparatus 1 can be simplified, and manufacturing cost of the substrate processing apparatus 1 can be reduced.

Further, in the above-described substrate processing apparatus 1, since the internal pressure of the substrate loading/unloading unit (substrate transit chamber 12) is set to be higher than the internal pressures of the first and second substrate transfer chambers 14 and 25, the clean air supplied into the first and second substrate transfer chambers 14 and 25 by the clean air flowing units 41 and 42 flows within the first and second substrate transfer chambers 14 and 25 without interfering with the clean air introduced from the substrate transit chamber 12. Thus, dispersion of particles or the like due to disturbance of the flow of the clean air and adhesion of the particles to the substrate 2 can be avoided.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

What is claimed is:

1. A substrate processing apparatus comprising:
   a substrate loading/unloading unit that transfers a substrate accommodated in a carrier;
   a substrate transfer chamber communicating with the substrate loading/unloading unit via a substrate loading/unloading port;
   a plurality of substrate processing chambers arranged along the substrate transfer chamber;
   a substrate transfer device provided in the substrate transfer chamber and configured to transfer the substrate between the substrate loading/unloading unit and the substrate processing chambers; and
   a first clean air flowing unit that includes an air supply unit and an air exhaust unit and allows clean air to flow in the substrate transfer chamber,
   wherein the first clean air flowing unit generates a flow of clean air in an arrangement direction of the plurality of substrate processing chambers within the substrate transfer chamber,
   the substrate loading/unloading port and the air supply unit are provided at a first sidewall of the substrate transfer chamber,
   the air supply unit is provided above the substrate loading/unloading port, and the air exhaust unit is provided at a second sidewall which is opposite to the first sidewall.

2. The substrate processing apparatus of claim 1, wherein the air supply unit and the substrate loading/unloading port are provided at a partition wall that separates and hermetically seals the substrate transfer chamber from a substrate transit chamber.

3. The substrate processing apparatus of claim 1, wherein the air supply unit is provided at a position capable of generating the flow of clean air in a horizontal direction within a range of a substrate transfer region in which the substrate is transferred by the substrate transfer device.

4. The substrate processing apparatus of claim 1, wherein the substrate transfer chamber is provided with the substrate loading/unloading port in a height range corresponding to a substrate transfer region in which the substrate is transferred by the substrate transfer device.

5. The substrate processing apparatus of claim 1, wherein a second clean air flowing unit is provided within the substrate loading/unloading unit and the second clean air flowing unit allows clean air to flow downward from the top within the substrate loading/unloading unit, and
   an internal pressure of the substrate loading/unloading unit is set to be higher than an internal pressure of the substrate transfer chamber.

6. A substrate processing apparatus comprising:
   a substrate loading/unloading unit that transfers a substrate accommodated in a carrier;
   a plurality of substrate transfer chambers communicating with the substrate loading/unloading unit via a plurality of substrate loading/unloading ports;
   a plurality of substrate processing chambers arranged along the substrate transfer chambers;

a plurality of substrate transfer devices provided in the substrate transfer chambers and configured to transfer the substrate between the substrate loading/unloading unit and the substrate processing chambers; and a plurality of clean air flowing units, each including an air supply unit and an air exhaust unit and allowing clean air to flow in each of the substrate transfer chambers, wherein the substrate processing chambers and the substrate transfer chambers are vertically arranged in multiple levels, and each clean air flowing unit is provided in each substrate transfer chamber, wherein each clean air flowing unit generates a flow of clean air in an arrangement direction of the plurality of substrate processing chambers within each substrate transfer chamber, each substrate loading/unloading port and the air supply unit of each clean air flowing unit are provided at a first sidewall of each substrate transfer chamber, the air supply unit of each clean air flowing unit is provided above each substrate loading/unloading port, and the air exhaust unit of each clean air flowing unit is provided at a second sidewall of each substrate transfer chamber which is opposite to the first sidewall of each substrate transfer chamber.

* * * * *